United States Patent

Uchida

[11] Patent Number: 6,040,738
[45] Date of Patent: Mar. 21, 2000

[54] DIRECT CONVERSION RECEIVER USING SINGLE REFERENCE CLOCK SIGNAL

[75] Inventor: Jun Uchida, Shizuoka, Japan

[73] Assignee: NEC Corporation, Tokyo, Japan

[21] Appl. No.: 09/201,176

[22] Filed: Nov. 30, 1998

[30] Foreign Application Priority Data

Dec. 10, 1997 [JP] Japan ................................ 9-339550

[51] Int. Cl.$^7$ .............................. H04Q 7/14; H04Q 7/18; H03D 3/00; H04L 27/14; H04L 27/152

[52] U.S. Cl. .......................... 329/302; 340/825; 375/334; 375/346; 455/31.1

[58] Field of Search .................................. 329/300–310, 329/325, 326, 360; 331/16, 18, 23; 340/825, 825.14, 825.2, 825.21; 375/324–328, 334–337, 346; 455/31.1–38.5

[56] References Cited

U.S. PATENT DOCUMENTS

| 5,696,792 | 12/1997 | Sudo et al. | 375/279 |
| 5,920,271 | 7/1999 | Hwang | 340/825.44 |
| 5,983,082 | 11/1999 | Hilbert | 455/76 |

FOREIGN PATENT DOCUMENTS

| 58-81337 | 5/1983 | Japan . |
| 3-60524 | 3/1991 | Japan . |

*Primary Examiner*—David Mis
*Attorney, Agent, or Firm*—Scully, Scott, Murphy & Presser

[57] ABSTRACT

A direct conversion receiver includes a reference clock signal generating section for generating reference clock signal. An amplifier section amplifies a received signal and extracts a desired signal from the amplified signal. An extraction reference clock signal generating section frequency-divides the reference clock signal based on a frequency division data to generate first and second extraction reference clock signals. An extracting section extracts a data from the desired signal and the first and second extraction reference clock signals. A control and processing section outputs the frequency division data to the extraction reference clock signal generating section and processes the data based on a control section clock signal corresponding to the reference clock signal.

19 Claims, 4 Drawing Sheets

DIRECT CONVERSION RECEIVER USING SINGLE REFERENCE CLOCK SIGNAL

BACKGROUND OF THE INVENTION

1. Field of the Invention

The present invention relates to a direct conversion receiver, and more particularly to improvement of a portable receiver such as a pager in which a direct conversion receiver is contained.

2. Description of the Related Art

In a receiver of a direct conversion reception system, a reception signal is mixed with a local oscillation signal in frequency to be converted into an intermediate frequency signal. The intermediate frequency signal is demodulated and is subjected to data processing. In this case, the difference between a desired reception signal and the local oscillation signal in frequency is derived as the intermediate frequency signal. For this purpose, it is necessary to control the local oscillation signal, and a PLL (phase locked loop) synthesizer is used for this control.

The PLL synthesizer has a function to compare between the local oscillation signal outputted from a VCO (voltage controlled oscillator) and the reference clock signal in frequency to control the VCO in accordance with the comparing result.

On the other hand, the receiver is provided with a control circuit for digital processing to take a timing with the desired wave signal, to process and display a data contained in the desired wave signal. A control system operation clock signal is used for the operation of this control circuit.

In this way, in the conventional direct conversion receiver which uses a PLL synthesizer, the reference clock signal for the PLL circuit and the control system operation clock signal for the control circuit are independent each other. Especially, in the pager, low cost, light weight and small size are required. However, at least two crystal oscillators are necessary for two clock signals. The crystal oscillator is an expensive part. Therefore, this is contrary to requirement of the low cost, the light weight and the small size.

Also, as to harmonic wave noise due to clock signals generated in the pager, there are two kinds of different noise components which are respectively generated from the clock signals of the two crystal oscillators. For this reason, it is very difficult to maintain radio reception characteristics.

Otherwise, a frequency synthesizer is described in Japanese Laid Open Patent Application (JP-A-Showa 58-81337). In the frequency synthesizer, each of a plurality of phase synchronizing circuits has a voltage controlled oscillator and the phase synchronizing circuits use a common reference oscillator. A switch sequentially selects one of the outputs from the voltage controlled oscillators. A variable frequency divider divides the output from the switch in frequency. A comparator compares the output from the variable frequency divider and the output of the reference oscillator in phase. A selector selects the output of the comparator in synchronous with the operation of the switch. A holding circuit holds the output of the selector as a control voltage to supply to the voltage controlled oscillator through a loop filter. The holding circuit is provided for every phase synchronizing circuit. A control section operates based on the output of the reference oscillator to control the switch, the variable frequency divider and the selector.

Also, a dual PLL apparatus is described in Japanese Laid Open Patent Application (JP-A-Heisei 3-60524). In a dual PLL apparatus, a first PLL circuit is provided with a common reference clock signal generator. A first phase frequency comparator is supplied with a reference clock signal from the reference clock signal generator. The output of the first phase frequency comparator is supplied to a first loop filter. The output of the first loop filter is supplied to a first voltage controlled oscillator. In a second PLL circuit, the reference clock signal is supplied to a delay circuit from the reference clock signal generator. The output of the delay circuit is supplied to a second phase frequency comparator. The output of the second phase frequency comparator is supplied to a second loop filter. The output of the second loop filter is supplied to a second voltage controlled oscillator. In this case, the output of the reference clock signal generator is supplied to the second phase frequency comparator of the second PLL circuit through the delay circuit. At the same time, the output of the reference clock signal generator is supplied to the first phase frequency comparator of the first PLL circuit directly without passing through the delay circuit.

SUMMARY OF THE INVENTION

Therefore, the present invention is accomplished to solve the conventional problems. An object of the present invention is to provide a direct conversion receiver in which reception characteristics are improved while satisfying the low cost, the light weight and the small size.

Another object of the present invention is to provide of a method of receiving a data in a direct conversion receiver.

In order to achieve an aspect of the present invention, a direct conversion receiver includes a reference clock signal generating section for generating reference clock signal. An amplifier section amplifies a received signal and extracts a desired signal from the amplified signal. An extraction reference clock signal generating section frequency-divides the reference clock signal based on a frequency division data to generate first and second extraction reference clock signals. An extracting section extracts a data from the desired signal and the first and second extraction reference clock signals. A control and processing section outputs the frequency division data to the extraction reference clock signal generating section and processes the data based on a control section clock signal corresponding to the reference clock signal.

Here, the frequency division data is selected such that frequencies of the first and second extraction reference clock signals are set to a frequency of a carrier wave of the desired signal. Also, the first extraction reference clock signal is phase-shifted from the second extraction reference clock signal by 90 degrees.

The extraction reference clock signal generating section includes a phase locked loop (PLL) section, a voltage controlled oscillator and a phase shifter. The PLL section compares a first clock signal obtained from the reference clock signal and a second clock signal obtained from an oscillation signal in response to the frequency division data, and outputs a DC voltage based on the comparing result. The voltage controlled oscillator oscillates based on the DC voltage to generate the oscillation signal and outputs the oscillation signal to the PLL section and to the extracting section as the first extraction reference clock signal. The phase shifter phase-shifts the oscillation signal by a predetermined angle to generate the second extraction reference clock signal.

The control section clock signal is the reference clock signal, the PLL section includes a first frequency divider, a second frequency divider, a comparator and a low pass filter.

The first frequency divider frequency-divides the reference clock signal based on a first frequency division value of the frequency division data to generate the first clock signal. The second frequency divider frequency-divides the oscillation signal based on a second frequency division value of the frequency division data to generate the second clock signal. The comparator compares the first clock signal and the second clock signal in phase and frequency. The low pass filter outputs the DC voltage to the voltage controlled oscillator based on the comparing result of the comparator. In this case, the first frequency divider includes a cascade connection of flip-flop circuits, and outputs, as the first clock signal, an output of a stage of flip-flop circuit which is defined based on the first frequency division value.

In order to achieve another aspect of the present invention, a direct conversion receiver includes a reference clock signal generating section for generating reference clock signal. An amplifier section amplifies a received signal and extracts a desired signal from the amplified signal. A clock signal generating section frequency-divides the reference clock signal, and outputs first and second extraction reference clock signals based on a frequency division data and a timing clock signal and a system clock signal based on a frequency selection data. A frequency selecting section outputs the frequency selection data to the clock signal generating section in response to a selection signal. An extracting section extracts a data from the desired signal and the first and second extraction reference clock signals. A control and processing section outputs the selection signal to the frequency selecting section, outputs the frequency division data to the extraction reference clock signal generating section, takes a timing with the desired signal based on the timing clock signal and processes the data based on the system clock signal.

The frequency division data is selected such that frequencies of the first and second extraction reference clock signals are set to a frequency of a carrier wave of the desired signal, and the first extraction reference clock signal is phase-shifted from the second extraction reference clock signal by 90 degrees.

The frequency selection data is outputted such that the timing clock signal with one of a plurality of different frequencies and the system clock signal with one of a plurality of different frequencies are selected.

The timing clock signal and the system clock signal are selected such that the desired signal is not interfered with harmonic wave signals of the timing clock signal and system clock signal.

The clock signal generating section includes a phase locked loop (PLL) section, a voltage controlled oscillator and a phase shifter. The PLL section frequency-divides the reference clock signal, outputs the timing clock signal and the system clock signal to the control section. Also, the PLL circuit compares a first clock signal obtained from the reference clock signal and a second clock signal obtained from an oscillation signal in response to the frequency division data, and outputs a DC voltage based on the comparing result. The voltage controlled oscillator oscillates based on the DC voltage to generate the oscillation signal, and outputs the oscillation signal to the PLL section and to the extracting section as the first extraction reference clock signal. The phase shifter phase-shifts the oscillation signal by a predetermined angle to generate the second extraction reference clock signal.

The PLL section includes a first frequency divider, a second frequency divider, a comparator and a low pass filter. The first frequency divider frequency-divides the reference clock signal based on a first frequency division value of the frequency division data to generate the first clock signal, and outputting the timing clock signal and the system clock signal to the control section based on the frequency selection data. The second frequency divider frequency-divides the oscillation signal based on a second frequency division value of the frequency division data to generate the second clock signal. The comparator compares the first clock signal and the second clock signal in phase and frequency. The low pass filter outputs the DC voltage to the voltage controlled oscillator based on the comparing result of the comparator.

The first frequency divider includes a cascade connection of flip-flop circuits, and outputs, as the first clock signal, an output of a stage of flip-flop circuit which is defined based on the first frequency division value.

In order to achieve still another aspect of the present invention, a method of receiving a data in a direct conversion receiver, includes the steps of:

generating reference clock signal;

receiving a desired signal;

generating first and second extraction reference clock signals based on a frequency division data;

extracting a data from the desired signal and the first and second extraction reference clock signals; and processing the data in response to an operation clock signal corresponding to the reference clock signal.

The operation clock signal is equal to the reference clock signal. Instead, the operation clock signal includes a timing clock signal and a system clock signal, and the method may further include the step of generating the timing clock signal and the system clock signal from the reference clock signal based on a frequency selection signal.

The frequency division data may be designated such that frequencies of the first and second extraction reference clock signals are set to a frequency of a carrier wave of the desired signal, and the first extraction reference clock signal may be phase-shifted from the second extraction reference clock signal by 90 degrees.

The step of generating the timing clock signal and the system clock signal may include:

generating the timing clock signal and the system clock signal such that the timing clock signal has one of a plurality of different frequencies selected based on the frequency selection data and the system clock signal has one of a plurality of different frequencies selected based on the frequency selection data.

The timing clock signal and the system clock signal may be selected such that the desired signal is not interfered with harmonic wave signals of the timing clock signal and system clock signal. In this case, the step of generating first and second extraction reference clock signal may include:

frequency-dividing the reference clock signal based on a first frequency division value of the frequency division data to generate a first clock signal;

frequency-dividing an oscillation signal from a voltage controlled oscillator based on a second frequency division value of the frequency division data to generate a second clock signal;

comparing the first clock signal and the second clock signal in phase and frequency;

controlling the voltage controlled oscillator based on the comparing result to generate the oscillation signal, the oscillation signal being the first extraction reference clock signal;

phase-shifting the oscillation signal by a predetermined angle to generate the second extraction reference clock signal.

DESCRIPTION OF THE PREFERRED EMBODIMENTS

Next, the direct conversion receiver of the present invention will be described below in detail with reference to the attached drawings.

Figure 1:
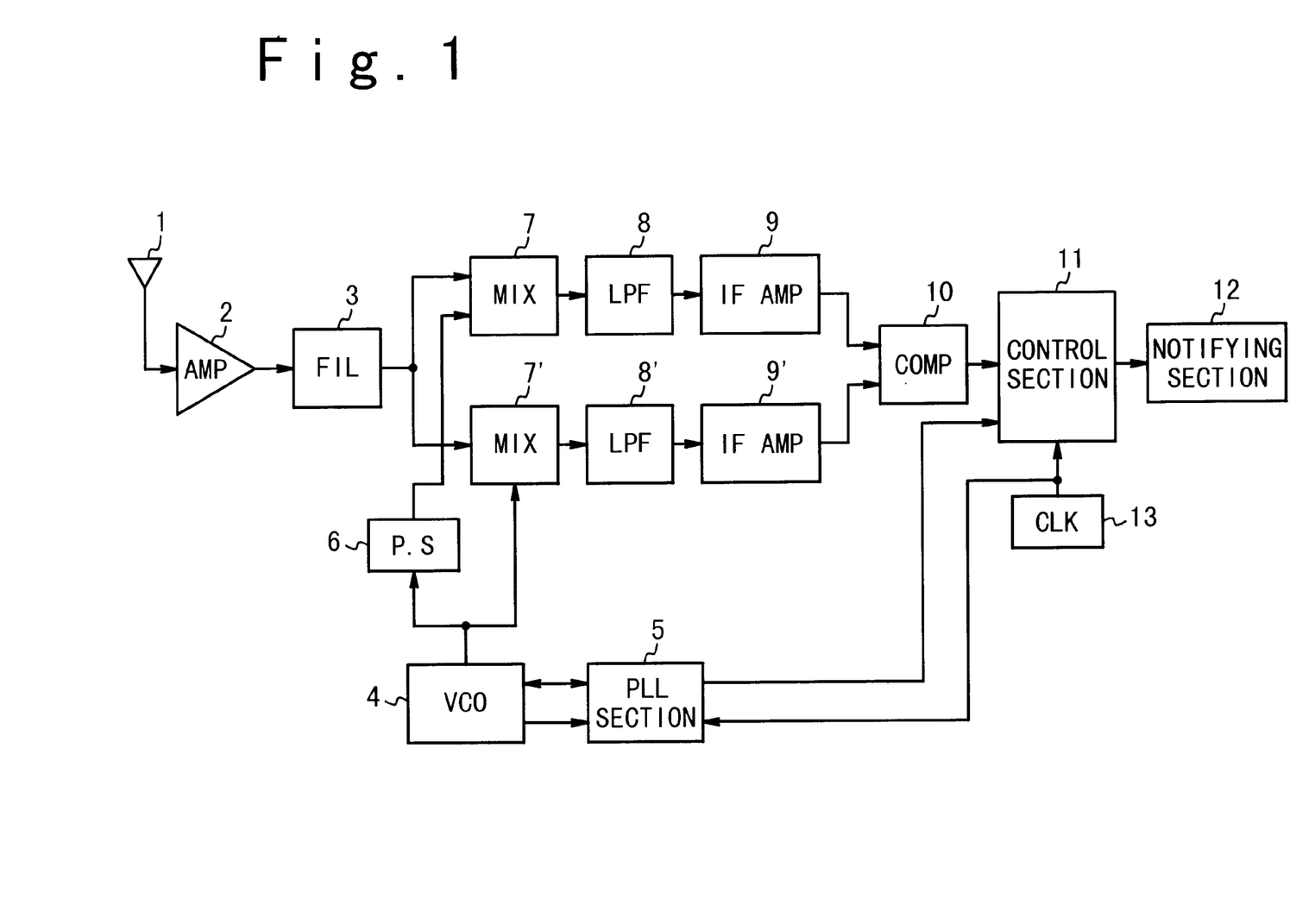
FIG. 1 is a system block diagram illustrating the structure of a direct conversion receiver according to an embodiment of the resent invention.

FIG. 1 is a block diagram of the embodiment of the present invention. Referring to FIG. 1, the direct conversion receiver is composed of an antenna 1, an amplifier (AMP) 2, a filter (FIL) 3, a voltage controlled oscillator (VCO) 4, a phase locked loop (PLL) section 5, a phase shifter (P.S.) 6, mixer (MIX) 7 and 7', low pass filters (LPF) 8 and 8', intermediate frequency signal amplifiers (IF AMP).9 and 9', a comparator (COMP) 10. a control section 11, a notifying section 12 and a reference clock signal generator (CLK) 13.

A radio signal is received by the antenna 1, amplified by the amplifier (AMP) 2 and supplied to the filter (FIL) 3. This filter 3 is a band pass filter which prevents passage of radio wave with any frequency band other than a frequency band of a desired wave signal to the receiver itself. In other words, only the desired wave signal is passed through the filter 3.

The output of this filter 3 is supplied to mixers (MIX) 7 and 7' for the frequency mixing, respectively. The mixers 7 and 7' mixes the desired wave signal with extraction clock signals in frequency so as to be converted into intermediate frequency signals which represent differences between the desired wave signal and the extraction clock signals, respectively. In this case, the extraction clock signals are generated by the PLL section 5, the VCO 4 and the phase shifter 6. The output of the VCO 4 is supplied to directly the mixer 7. Also, the output of this VCO 4 is shifted in phase by 90 by the phase shifter 6 and the output of the phase shifter (PS) 6 is supplied to the mixer 7.

After high frequency components of the intermediate frequency signals are removed by low pass filters (LPF) 8 and 8', the respective intermediate frequency signals are amplified by intermediate frequency signal amplifiers (IF AMP) 9 and 9'. Then, the outputs of the intermediate frequency signal amplifiers (IF AMP) 9 and 9' are supplied to the comparator (COMP) 10. A path of the above mentioned the mixer (MIX) 7, the low pass filter (LPF) 8 and the intermediate frequency signal amplifier (IF AMP) 9 is a Q channel signal path, and a path of the mixer (MIX) 7', the low pass filter (LPF) 8' and the intermediate frequency signal amplifier (IF AMP) 9' is an I channel signal path.

A control section 11 has a function to control each section. The control section 11 processes decoded data as the output from the comparator 10, performs the control of the PLL section 5, and performs the display control of the notifying section 12 to notify reception of the data to a user. In the present invention, the output of the reference clock signal oscillator (CLK) 13 is a reference clock signal for the PLL section 5 and commonly is a control system operation clock signal of the control section 11.

In such a structure, the desired wave signal is received by the antenna 1 and amplified by the amplifier 2. Then, an interference signal other than the desired wave signal is removed by the filter 3. The desired wave signal is supplied to each of the mixers 7 and 7' for the Q channel and the I channel, respectively.

On the other hand, the VCO 4 is controlled by the PLL section 5. The PLL section 5 operates based on a frequency division data which is set by the control section 11. The VCO 4 oscillates at a predetermined frequency under the control of the PLL section 5. The output of the VCO 4 is supplied to the mixer 7 through the phase shifter 6 in case of the Q channel and supplied to the mixer 7' just as it is, in case of the I channel. The phase shifter 6 shifts by 90° in phase without changing the frequency. The outputs of the phase shifter 6 and VCO 4 are supplied to the mixers 7 and 7' as extraction clock signals.

The frequency of the oscillation signal of the VCO 4 is set to a carrier signal frequency of the desired wave signal. The extraction clock signals are mixed with the desired wave signal with frequency shift (deviation) by the respective mixers 7 and 7'. Thus, frequency conversion (frequency down) is performed and the outputs of the mixers 7 and 7' are the frequency shift components. These frequencies are intermediate frequencies. An excess high frequency component which is higher than the intermediate frequency is cut by the low pass filters 8 and 8'. The filtered signals are amplified by the intermediate frequency amplifiers 9 and 9' to limit the amplitudes and are supplied to the comparator 10 as square wave signals.

Figure 2:
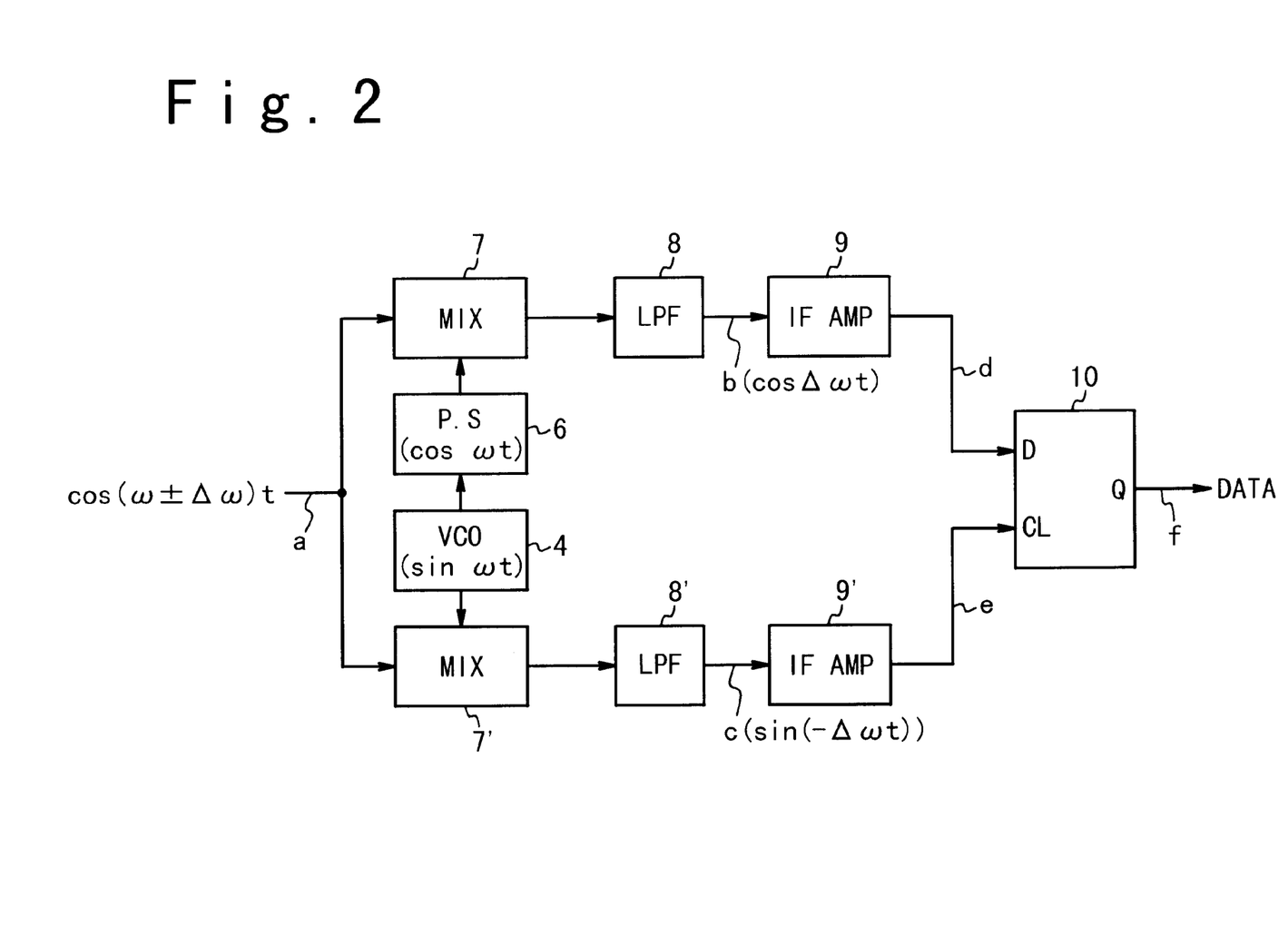
FIG. 2 is a diagram illustrating a part of the system block shown in FIG. 1 to explain the details of the operation of the direct conversion receiver shown.

FIG. 2 is a block diagram of a part of the direct conversion receiver shown in FIG. 1 to explain the operation of the receiver in more detailed. The same reference numerals as in FIG. 1 are allocated to the same components. The waveform examples of respective sections a to f in FIG. 2 are shown in FIGS. 3A to 3F.

Figure 3A:
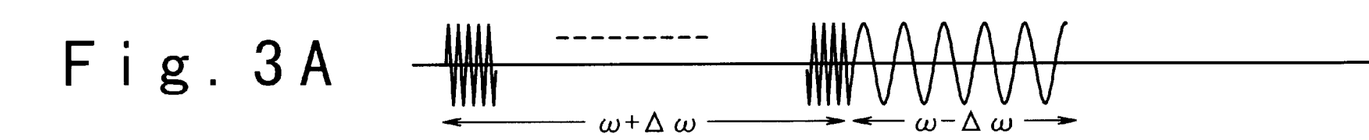
FIGS. 3A to 3F are a diagram illustrating each section operation waveform examples of the system block part shown in FIG. 2.

The demodulation of the reception signal will be described with reference to FIG. 2 and FIGS. 3A to 3F. It is supposed that the desired wave signal a with frequency deviation is $\cos(\omega \pm \Delta\omega)t$, as shown in FIG. 3A. This example shows the case where the frequency deviation changes from $+\Delta\omega$ into $-\Delta\omega$. This signal is supplied to the mixers 7 and 7', respectively.

On the other hand, when supposing that the output of the VCO 4 is $\sin \omega t$, the signal $\cos \omega t$ is supplied to the mixer 7 for the Q channel by the phase shifter 6. Also, the signal $\sin \omega t$ is supplied to the mixer 7' for the Q channel.

Figure 3B:
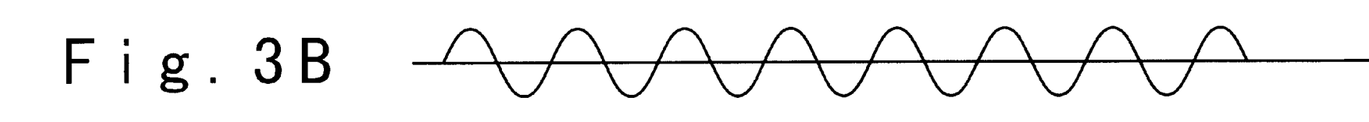
Figure 3C:
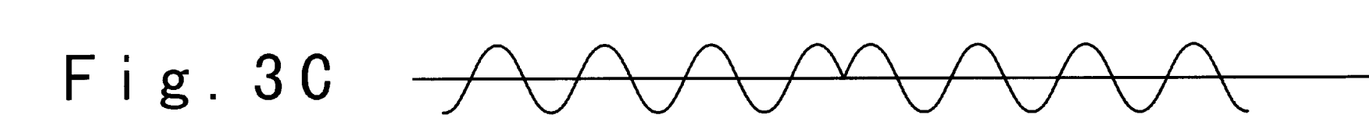

Therefore, signals $\cos \Delta\omega t$ and $\sin(\pm\Delta\omega t)$ are obtained as the outputs b and c of the low pass filters 8 and 8' to have the waveforms shown by FIG. 3B and 3C, respectively. The respective values of these signals b and c can be easily calculated from the following equations:

$$\cos(\omega \pm \Delta\omega)t \times \cos \omega t$$

$$\cos(\omega \pm \Delta\omega)t \times \sin \omega t$$

From this result, it could be understood that in the Q channel, the output is a constant $\cos \Delta\omega t$, even if the frequency deviation of the desired wave signal is "+" or "−", as shown in FIG. 3B. On the other hand, in the I channel, sin (+Δωt) is obtained when the frequency deviation is "+" and sin (−Δωt) is obtained when the frequency deviation is "−". Thus, depending upon the frequency deviation of "+" or "−", the phase is inverted, as shown in FIG. 3C.

Figure 3D:
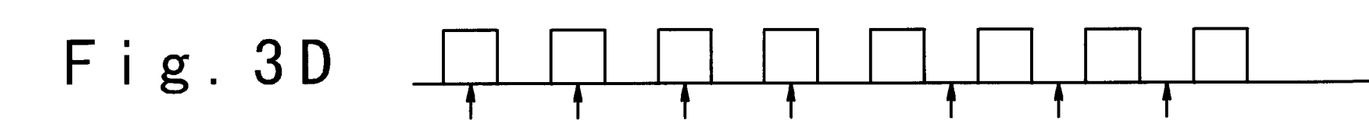
Figure 3E:
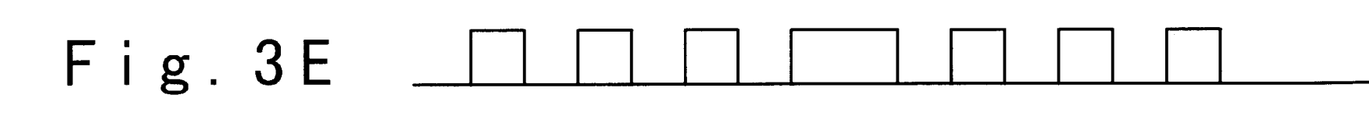
Figure 3F:
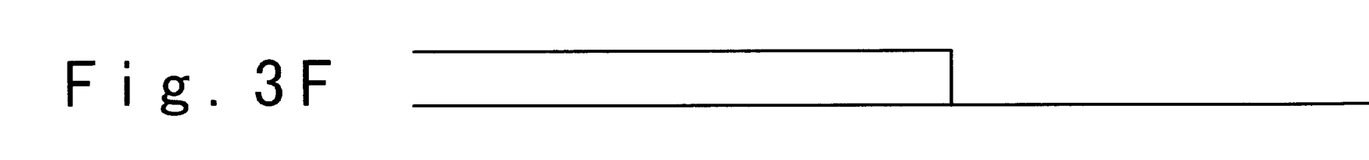

The signals shown in FIGS. 3B and 3C are amplified by the intermediate frequency signal amplifiers 9 and 9' respectively. At this time, the amplitudes of signals are limited such that the signals have rectangular waveforms as shown in FIGS. 3D and 3E, respectively. These two rectangular signals are respectively supplied to the data (D) terminal and the clock signal (CK) terminal of a flip-flop 10 which is the comparator. Thus, the signal shown in FIG. 3F is obtained. This waveform means that a high level data is obtained when the frequency deviation is "+" and a low level data is obtained when the frequency deviation is "−". Therefore, the frequency data is converted into a voltage data. Thus, the demodulation is performed.

Referring to FIG. 1 again, the data demodulated by the comparator 10 is supplied to the control section 11. When the demodulated data is coincident with a call number of the receiver, the reception of the data is displayed by the notifying section 12 so as to be notified to the user. The reference clock signal of the reference clock signal generator 13 is used as the control system operation clock signal. Also, the reference clock signal is used as the reference clock signal for the PLL section 5. Conventionally, both of the clock signals are generated from clock signal generators different from each other. Therefore, the above mentioned problem had occurred. For this reason, in the present invention, the single oscillator is used for both the clock signals.

Figure 4:
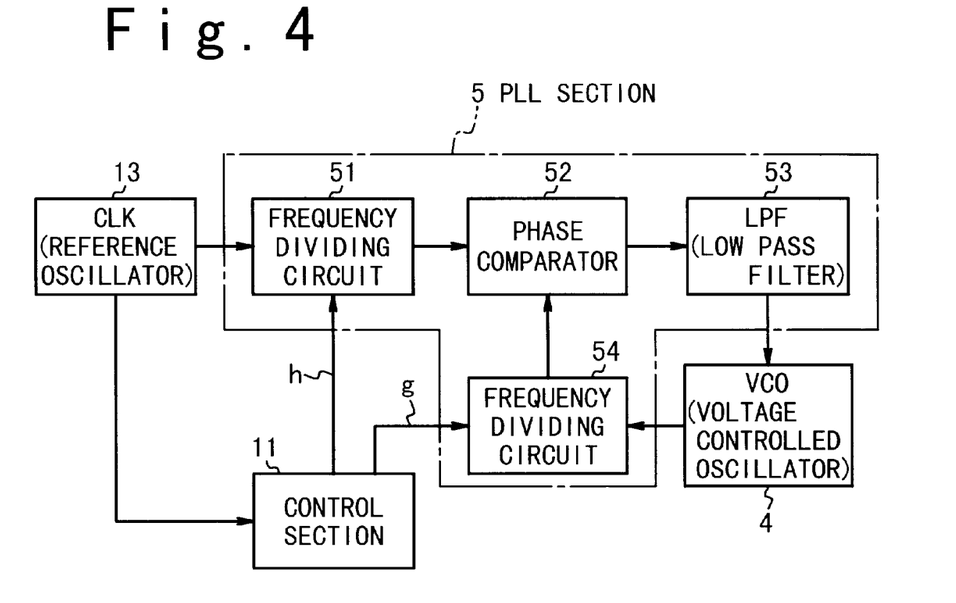
FIG. 4 is a diagram illustrating a part of the system block of the direct conversion receiver according to the first embodiment of the present invention.

The role of the reference clock signal for the PLL section 5 will be described with reference to FIG. 4. FIG. 4 shows the structure of the direct conversion receiver according to the first embodiment of the present invention.

The VCO 4 is a voltage controlled oscillator, and is controlled with the direct current voltage which is the output of the low pass filter 53. As a result, the VCO 4 oscillates at a desired frequency with stability. The output of the VCO 4 is divided in frequency by a frequency divider 54. The output of the frequency divider 54 a very low predetermined reference frequency (as low as a few KHz, usually) and is supplied to a phase comparator 52. The frequency divider 54 divides the oscillation signal from the VCO 4 in frequency in accordance with a frequency division value g as the frequency division data from the control section 11.

On the other hand, because the reference clock signal from the reference clock signal generator 13 has a fixed frequency, the reference clock signal is divided by a frequency divider 51 in frequency so as to generate the extraction clock signal which is supplied to the phase comparator 52. The frequency divider 51 is also controlled in accordance with the frequency division value h as the frequency division data from the control section 11. It should be noted that the reference clock signal from the reference clock signal generator 13 is used as the control system operation clock signal of the control section 11.

The outputs of the frequency dividers 51 and 54 are compared in frequency and phase by the phase comparator 52 and a voltage is outputted to correct the difference between the outputs of the frequency dividers 51. This output voltage is converted into a control direct current (DC) voltage by a LPF low pass filter 53 and the control of the VCO 4 is accomplished based on the control DC voltage. That is, the control DC voltage is decreased if the frequency of the VCO 4 is high, and is increased if the frequency of the VCO 4 is low. The above operation is repeated by the operation of the feedback loop of this PLL section 5 so that the output of the VCO 4 is locked to the desired frequency.

The PLL section 5 operates in such a manner that the signal obtained by dividing the reference clock signal from the reference clock signal generator 13 in frequency is coincident with the frequency of the output signal of the frequency divider 54. Therefore, when the frequency division value g supplied to the frequency divider 54 is changed, the frequency of the VCO 4 can be changed. This frequency division value g is previously set or stored in the control section 11. The setting or writing becomes possible easily for every pager.

For example, supposing that the reference clock signal, i.e., the output of the reference clock signal generator 13 is 10 MHz, the outputs of the frequency dividers 51 and 54 are 5 KHz, and the oscillation signal from the VCO 4 is 100 MHz, it is sufficient that the following frequency division data are previously written or set in the control section 11.

Frequency division value h of frequency divider 51=10 MHz/5 KHz=2000, and

Frequency division value g of frequency divider 54=100 MHz/5 KHz=20000.

Also, supposing that the reference clock signal is 10 MHz, the outputs of the frequency dividers 51 and 54 are 5 KHz, and the oscillation signal from the VCO 4 is 100.025 MHz, Frequency division value h of frequency divider 51=10 MHz/5 KHz=2000, and Frequency division value g of frequency divider 54=100.025 MHz/5 KHz=20005.

By setting the frequency division value to 20005, it is possible to make the VCO 4 to oscillate at the frequency higher by 25 KHz than the frequency in case of the frequency division value of 20000. In this way, the setting change of the frequency of the desired wave signal is possible only by changing the frequency division value.

Figure 5:
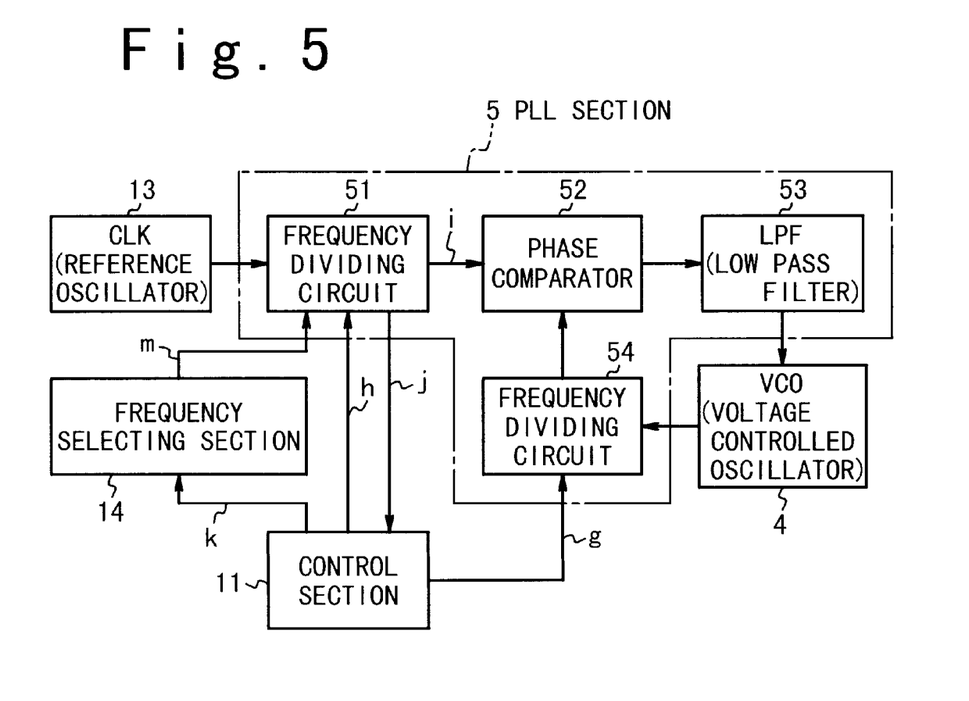
FIG. 5 is a diagram illustrating a part of the system block the direct conversion receiver according to the second embodiment of the present invention.

FIG. 5 is a block diagram illustrating the structure of the direct conversion receiver according to the second embodiment of the present invention. The same reference numerals as in FIG. 1 or 4 indicates the same components in FIG. 5. Describing the components different from those in FIG. 4, the reference clock signal of the reference clock signal generator 13 is not used just as it is, as the control system operation clock signal of the control section 11. Instead, the clock signal j with the frequency, which has been divided by the frequency divider 51 is used as the control system operation clock signal of the control section 11. As the outputs of the frequency divider 51, two kinds of outputs i and j are shown. The output i is obtained based on the above mentioned predetermined frequency division value h supplied from the control section 11 and is used as the reference clock signal for the PLL section 5. This is same as the example of FIG. 4.

On the other hand, the frequency selection value m for the frequency divider 51 is appropriately selected so that the control system operation clock signal j for the control section 11 can be obtained. The frequency selection value is selected and controlled based on a control signal k from the frequency selecting section 14. In this case, the frequency divider 51 is composed of a cascade connection structure of flip-flops. Therefore, the frequency selection value m can be changed based on which stage the clock signal is outputted from. Thus, the control system operation clock signal j can be determined based on selection of the output stage from among the cascade connection of flip-flops.

Therefore, the control signal k is outputted from the control section 11 to the frequency selecting section 14 and the desired frequency selection data m is generated by the division value selecting section 14 based on this control signal k. As a result, frequency setting of the control system operation clock signal j for the control section 11 is accomplished. The frequency selecting section 14 are allocated with two kinds of frequencies and can designate one of the frequencies based on the control signal k from the control section 11 such that the harmonic waves of the control system operation clock signal j does not interference with the desired wave signal.

In this way, the reason why one of two frequency selection data, i.e., two clock signal frequencies can be selected is in the improvement of the radio characteristic and the current consumption reduction. Generally, an LSI which is used for the control section 11 consumes more current as the control system operation clock signal is increased. In the practice, 10 MHz given in the above example is too high from the viewpoint of current consumption. Therefore, the current consumption can be made smaller if the reference clock signal is divided in frequency such that the LSI can operates in slightly decreased frequency.

As described above, if the frequency selecting section 14 has a function to select one of two kinds of frequencies, and the frequency is selected not to interface the desired wave signal, it is possible to prevent deterioration of the radio characteristics. Thus, it is made possible to select one of the two kinds of frequencies by the frequency selecting section 14. As a result, the better frequency can be selected for the frequency of the desired wave signal. Also, the control section 11 operates based on the control system operation clock signal j with the selected frequency. In this manner, the same effect as the example of FIG. 4 is accomplished while current consumption is suppressed.

Moreover, the frequency selecting section 14 may have a function to select two of four kinds of frequency selection data, two of which correspond to relatively low frequencies and the other of which correspond to relatively high frequencies. In this case, the efficiency is further increased. Usually, a pager uses a 2 control system operation clock signals for the control system. One is a timing clock signal to take timing with the desired wave signal and is relatively low frequency clock signal, and the other is a system clock signal to perform high speed processing and display of a reception data, and is a relatively high frequency clock signal.

When the control system operates based on the timing clock signal, the current consumption is small, and when the control system operates based on the system clock signal, the current consumption is large. If the frequency of the system clock signal is as small as the frequency of the timing clock signal, the user interface becomes very slow, so that the pager does not function as a product. Therefore, two kinds of clock signals is necessary for the control system.

Therefore, as mentioned above, if the frequency selecting section 14 has the function to select two of four kinds of frequency selection data, i.e., for two relatively low frequency timing clock signals and two relatively high frequency system clock signals, the pager can be realized with the high speed user interface with the low current consumption. In this case, the reason why the two frequency selection data for each of the timing clock signal and the system clock signal are provided is in that it is made possible to select the frequency which does not interfere with the desired wave signal.

It should be noted that the frequency selecting section 14 is structured in such a manner that the frequency selecting section 14 distinguishes the control signal k from the control section 11 to generate a frequency selection data m. The frequency division of the frequency divider 51 is determined based on the frequency selection data m. The clock signal j is outputted from one of flip-flop stages of the frequency divider 51 which is selected in accordance with this frequency selection data m, as described above.

As above mentioned, in the conventional example, a reference clock signal for the PLL synthesizer and the control system operation clock signal for the control system operation clock signal are provided independent to each other. However, in the present invention, both of the clock signals are commonly generated from a single reference clock signal. Therefore, the present invention contributes to the decrease of product cost and small size of the product to which the design technical expert pays attention the most. Also, large effect can be obtained as for the radio characteristics. Generally, the radio apparatus very dislikes noise which degrades the reception characteristics. However, such noise exists in receiver itself in addition to introduction from outside of the receiver. The noise introduced from outside of the receiver to interfere with the desired wave signal can not be prevented. However, it is necessary to prevent noise generated inside the receiver at least. The reception sensitivity of the receiver is greatly influenced by this noise.

When a clock signal passes through a non-linear element (such as a transistor) even if the frequency of the clock signal itself is low, harmonic waves are generated to extend frequencies to twice, 3 times, thousands of times . . . . When the frequencies of these harmonic waves are equal to or near to the frequency of the desired wave signal, the reception characteristics are degraded. In the conventional example, because two kinds of clock signals exist independently to each other so that two kinds of different frequency components exist, the reception characteristics are degraded mainly due to the harmonic waves.

However, in the present invention, it is attempted that the reference clock signal for the PLL section and the control system operation clock signal are generated from the single reference signal. Therefore, the influence of the harmonic waves can be decreased in half at least, so that the reception characteristics can be improved. Moreover, since the common clock signal is divided in frequency to generate the control system operation clock signal, one of a plurality of frequencies can be selected not to degrade the reception characteristics. Therefore, the low current consumption can be realized while the radio characteristics are maintained.

As described above, according to the present invention, the reference clock signal for the PLL synthesizer is used for a control system operation clock signal, too. Therefore, it is possible to realize small size, light weight and low production cost. Also, the generation of the harmonic wave components can be suppressed not to give bad influence to the reception characteristic, and the improvement of the reception characteristics is made possible.

Also, according to the present invention, the clock signal obtained by dividing the reference clock signal in frequency is used as the control system operation clock signal, and the frequency division value can be freely selected. Thus, it is made possible to easily select the clock signal frequency such that the harmonic waves do not influence to the desired wave signal. Moreover, the frequency selection data can be selected such that a low frequency clock signal and a high frequency clock signal are obtained. Therefore, a pager can be realized in which two kinds of clock signal frequencies for the control system can be set as the low speed operation and the high-speed operation. Thus, the pager with good user interface characteristic can be accomplished at the low power consumption.

What is claimed is:

1. A direct conversion receiver comprising:
   an amplifier section for amplifying a received signal and extracting a desired signal from the amplified signal;
   a reference clock signal generating section for generating reference clock signal;
   an extraction reference clock signal generating section for frequency-dividing said reference clock signal based on a frequency division data to generate first and second extraction reference clock signals;
   an extracting section for extracting a data from said desired signal and said first and second extraction reference clock signals; and
   a control and processing section for outputting said frequency division data to said extraction reference clock signal generating section and for processing said data based on a control section clock signal corresponding to said reference clock signal.

2. A direct conversion receiver according to claim 1, wherein said frequency division data is selected such that frequencies of said first and second extraction reference clock signals are set to a frequency of a carrier wave of said desired signal, and said first extraction reference clock signal is phase-shifted from said second extraction reference clock signal by 90 degrees.

3. A direct conversion receiver according to claim 1, wherein said extraction reference clock signal generating section comprises:
   a phase locked loop (PLL) section for comparing a first clock signal obtained from said reference clock signal and a second clock signal obtained from an oscillation signal in response to said frequency division data and for outputting a DC voltage based on the comparing result;
   a voltage controlled oscillator oscillating based on said DC voltage to generate said oscillation signal and for outputting said oscillation signal to said PLL section and to said extracting section as said first extraction reference clock signal; and
   a phase shifter for phase-shifting said oscillation signal by a predetermined angle to generate said second extraction reference clock signal.

4. A direct conversion receiver according to claim 3, wherein said control section clock signal is said reference clock signal, and
   wherein said PLL section comprises:
   a first frequency divider for frequency-dividing said reference clock signal based on a first frequency division value of said frequency division data to generate said first clock signal;
   a second frequency divider for frequency-dividing said oscillation signal based on a second frequency division value of said frequency division data to generate said second clock signal;
   a comparator for comparing said first clock signal and said second clock signal in phase and frequency; and
   a low pass filter for outputting said DC voltage to said voltage controlled oscillator based on the comparing result of said comparator.

5. A direct conversion receiver according to claim 4, wherein said first frequency divider includes a cascade connection of flip-flop circuits, and outputs, as said first clock signal, an output of a stage of flip-flop circuit which is defined based on said first frequency division value.

6. A direct conversion receiver comprising:
   an amplifier section for amplifying a received signal and extracting a desired signal from the amplified signal;
   a reference clock signal generating section for generating reference clock signal;
   a clock signal generating section for frequency-dividing said reference clock signal, and for outputting first and second extraction reference clock signals based on a frequency division data and a timing clock signal and a system clock signal based on a frequency selection data;
   a frequency selecting section for outputting said frequency selection data to said clock signal generating section in response to a selection signal;
   an extracting section for extracting a data from said desired signal and said first and second extraction reference clock signals; and
   a control and processing section for outputting said selection signal to said frequency selecting section, for outputting said frequency division data to said extraction reference clock signal generating section, for taking a timing with said desired signal based on said timing clock signal and for processing said data based on said system clock signal.

7. A direct conversion receiver according to claim 6, wherein said frequency division data is selected such that frequencies of said first and second extraction reference clock signals are set to a frequency of a carrier wave of said desired signal, and said first extraction reference clock signal is phase-shifted from said second extraction reference clock signal by 90 degrees.

8. A direct conversion receiver according to claim 7, wherein said frequency selecting section outputs said frequency selection data such that said timing clock signal with one of a plurality of different frequencies and said system clock signal with one of a plurality of different frequencies are selected.

9. A direct conversion receiver according to claim 6, wherein said timing clock signal and said system clock signal are selected such that said desired signal is not interfered with harmonic wave signals of said timing clock signal and system clock signal.

10. A direct conversion receiver according to claim 6, wherein said clock signal generating section comprises:
    a phase locked loop (PLL) section for frequency-dividing said reference clock signal, for outputting said timing clock signal and said system clock signal to said control section, for comparing a first clock signal obtained from said reference clock signal and a second clock signal obtained from an oscillation signal in response to said frequency division data, and for outputting a DC voltage based on the comparing result;
    a voltage controlled oscillator oscillating based on said DC voltage to generate said oscillation signal, and for outputting said oscillation signal to said PLL section and to said extracting section as said first extraction reference clock signal; and
    a phase shifter for phase-shifting said oscillation signal by a predetermined angle to generate said second extraction reference clock signal.

11. A direct conversion receiver according to claim 10, wherein said PLL section comprises:
    a first frequency divider for frequency-dividing said reference clock signal based on a first frequency division value of said frequency division data to generate said first clock signal, and for outputting said timing clock signal and said system clock signal to said control section based on said frequency selection data;

a second frequency divider for frequency-dividing said oscillation signal based on a second frequency division value of said frequency division data to generate said second clock signal;

a comparator for comparing said first clock signal and said second clock signal in phase and frequency; and a low pass filter for outputting said DC voltage to said voltage controlled oscillator based on the comparing result of said comparator.

12. A direct conversion receiver according to claim 11, wherein said first frequency divider includes a cascade connection of flip-flop circuits, and outputs, as said first clock signal, an output of a stage of flip-flop circuit which is defined based on said first frequency division value.

13. A method of receiving a data in a direct conversion receiver, comprising the steps of:

generating reference clock signal;

receiving a desired signal;

generating first and second extraction reference clock signals based on a frequency division data;

extracting a data from said desired signal and said first and second extraction reference clock signals; and processing said data in response to an operation clock signal corresponding to said reference clock signal.

14. A method according to claim 13, wherein said operation clock signal is equal to said reference clock signal.

15. A method according to claim 13, wherein said operation clock signal includes a timing clock signal and a system clock signal, and wherein said method further comprises the step of generating said timing clock signal and said system clock signal from said reference clock signal based on a frequency selection signal.

16. A method according to claim 13, wherein said frequency division data is designated such that frequencies of said first and second extraction reference clock signals are set to a frequency of a carrier wave of said desired signal, and said first extraction reference clock signal is phase-shifted from said second extraction reference clock signal by 90 degrees.

17. A method according to claim 15, wherein said step of generating said timing clock signal and said system clock signal includes:

generating said timing clock signal and said system clock signal such that said timing clock signal has one of a plurality of different frequencies selected based on said frequency selection data and said system clock signal has one of a plurality of different frequencies selected based on said frequency selection data.

18. A method according to claim 17, wherein said timing clock signal and said system clock signal are selected such that said desired signal is not interfered with harmonic wave signals of said timing clock signal and system clock signal.

19. A method according to claim 15, wherein said step of generating first and second extraction reference clock signal includes:

frequency-dividing said reference clock signal based on a first frequency division value of said frequency division data to generate a first clock signal;

frequency-dividing an oscillation signal from a voltage controlled oscillator based on a second frequency division value of said frequency division data to generate a second clock signal;

comparing said first clock signal and said second clock signal in phase and frequency;

controlling said voltage controlled oscillator based on the comparing result to generate said oscillation signal, said oscillation signal being said first extraction reference clock signal; and phase-shifting said oscillation signal by a predetermined angle to generate said second extraction reference clock signal.

* * * * *